United States Patent

Kita et al.

[11] Patent Number: 5,907,470
[45] Date of Patent: May 25, 1999

[54] DIELECTRIC THIN FILM CAPACITOR ELEMENT

[75] Inventors: Ryusuke Kita, Matsudo; Yoshiyuki Masuda, Noda; Yoshiyuki Matsu, Kashiwa; Noboru Ohtani, Tokyo; Seiki Yano, Kashiwa, all of Japan

[73] Assignee: Sharp Kabushiki Kaisha, Osaka, Japan

[21] Appl. No.: 08/870,629

[22] Filed: Jun. 6, 1997

[30] Foreign Application Priority Data

Jun. 7, 1996 [JP] Japan ..................... 8-145422

[51] Int. Cl.$^6$ ........................................ H01G 4/06
[52] U.S. Cl. ..................... 361/311; 361/313; 361/321.5; 361/322; 257/295
[58] Field of Search ................ 361/301.8, 305, 361/306.3, 311–313, 314, 315, 321.1, 321.2, 321.3, 321.4, 321.5, 328, 342; 29/25.42, 623.1; 257/295, 296, 303, 306, 310, 528; 365/145, 149

[56] References Cited

U.S. PATENT DOCUMENTS

| | | | |
|---|---|---|---|
| 5,453,908 | 9/1995 | Tsu et al. ...................... | 361/321.5 |
| 5,471,364 | 11/1995 | Summerfelt et al. ............. | 361/321.4 |
| 5,548,475 | 8/1996 | Ushikubo et al. ............... | 361/321.4 |
| 5,578,845 | 11/1996 | Masuda et al. ................. | 257/295 |
| 5,635,741 | 6/1997 | Tsu et al. ..................... | 257/310 |
| 5,734,545 | 3/1998 | Sano et al. .................... | 361/321.4 |

FOREIGN PATENT DOCUMENTS

A 6-326250  11/1994  Japan .

OTHER PUBLICATIONS

"Stabilized Barium Titanate Ceramics for Capacitor Dielectrics", by J.B. MacChesney et al., Journal of the American Ceramic Society, May 21, 1963, vol. 46, No. 5, pp. 197–202.

"dc Electrical Degradation of Perovskite–Type Titanates: I, Ceramics" by R. Waser, Journal of the American Ceramic Society, vol. 73, No. 6, 1990 pp. 1645–1653.

*Primary Examiner*—Kristine Kincaid
*Assistant Examiner*—Anthony Dinkins
*Attorney, Agent, or Firm*—Birch, Stewart, Kolasch & Birch, LLP

[57] ABSTRACT

The present invention provides a dielectric thin film capacitor element in which leak current may be suppressed from increasing over time while energizing at high temperature and which has excellent insulating quality and reliability and a manufacturing method thereof. The dielectric thin film capacitor element is constructed by forming a lower electrode, a dielectric thin film and an upper electrode one after another on a substrate, wherein the dielectric thin film capacitor element is characterized in that the dielectric thin film is made of an oxide material composed of at least titanium and strontium and containing erbium.

6 Claims, 8 Drawing Sheets

DEPENDENCY OF tch ON DOPED Er AMOUNT IN Er DOPED STO FILM

DEPENDENCY OF DIELECTRIC CONSTANT ON DOPED Er AMOUNT IN Er DOPED STO FILM

DEPENDENCY OF SPECIFIC RESISTANCE ON DOPED Er AMOUNT IN Er DOPED STO FILM

DEPENDENCY OF tch ON DOPED Er
AMOUNT IN Er DOPED BST FILM

DEPENDENCY OF DIELECTRIC CONSTANT ON DOPED Er AMOUNT IN Er DOPED BST FILM

DEPENDENCY OF SPECIFIC RESISTANCE ON DOPED Er AMOUNT IN Er DOPED BST FILM

DEPENDENCY OF AMOUNT OF La OR Er IN STO FILM
ON NUMBER OF TIMES OF FILM FORMATION

DIELECTRIC THIN FILM CAPACITOR ELEMENT

BACKGROUND OF THE INVENTION

1. Field of the Invention

The present invention relates to a dielectric thin film capacitor element used for electronic parts such as an IC capacitor, and a nonvolatile memory device and to a method of manufacturing the same.

2. Description of Related Art

Hitherto, $Ta_2O_5$ (tantalum pentoxide), $SiO_2$ (silicon dioxide) and SiN (silicon nitride) have been mainly used as a dielectric material of a dielectric thin film capacitor for an IC typified by a signal accumulating capacitor of a DRAM and a capacitor for a microwave device of a MMIC (Microwave Monolithic Integrated Circuit). However, with the recent miniaturization and high-integration of electronic parts along the progress of the semiconductor technology, an extra-thin dielectric thin film or three-dimensional dielectric thin film has come to be fabricated in order to reduce capacitor area. For this reason, a process for fabricating semiconductor devices has become more and more complicated and the micro-processing technology has come close to its limit, causing a problem in yield, reliability and the like. Then, a dielectric thin film having a higher dielectric constant as compared to that of the conventional dielectric thin film has become necessary. Presently, a research on an oxide high dielectric thin film made of $SrTiO_3$ (strontium titanate) or $(Ba, Sr)TiO_3$ (barium strontium titanate) having a higher dielectric constant as compared to $SiO_2$ and SiN described above is being actively conducted.

However, the dielectric thin film capacitor element using the conventional oxide high dielectric thin film such as $SrTiO_3$ and $(Ba, Sr)TiO_3$ described above has had a big problem in its reliability. That is, no high dielectric thin film capacitor element which provides practical enough characteristics has been realized yet in a high temperature energizing test, which is a usual reliability test for electronic parts, in which a certain voltage is applied to a capacitor while holding the capacitor at a certain temperature. For example, in a high temperature energizing test of bias application of 10 V to the capacitor while holding the capacitor at 100° C., leak current increases by three to four digits in about 10 hours, causing a problem of degradation of resistance of the capacitor such that it cannot maintain the insulation required as the capacitor.

The degradation of the resistance of the capacitor is considered to be caused by the following reason. In the oxide high dielectric thin film such as $SrTiO_3$ and $(Ba, Sr)TiO_3$, a lattice defect of oxygen (oxygen vacancy) occurs within the thin film during its growth. Because the oxygen vacancy is electrified to +bivalent in a capacitor element composed of the dielectric thin film containing the oxygen vacancy, the oxygen vacancy moves to the cathode side when the capacitor element is heated and voltage is applied between electrodes thereof during the high temperature energizing test. Then, the oxygen vacancy which has moved to the cathode side cannot move to the cathode due to a potential barrier of the cathode and $SrTiO_3$ or $(Ba, Sr)TiO_3$ and it increases at the boundary of the cathode and the dielectric thin film. At this time, electrons are injected from the cathode side to electrically compensate for it. Further although oxygen vacancy is introduced newly from the anode side, the electrons are generated as a carrier at this time. Due to these phenomena, the conductivity increases as time passes by and leak current increases in the dielectric thin film as a whole.

It is conceivable to implement an oxygen annealing treatment or oxygen plasma treatment in which heat treatment is implemented within an oxygen atmosphere after forming the film in order to compensate for the oxygen vacancy and to prevent the capacitor from degrading. However, even if such treatment is implemented, it is difficult to reduce the oxygen vacancy after forming the dielectric thin film because oxygen is not stably incorporated into a dielectric crystal lattice in terms of thermal equilibrium.

As a prior art technology, an experimental example in which a characteristic time tch until the occurrence of a dielectric breakdown could be prolonged, when energized in high temperature, by doping $La_2O_3$ to a bulk ceramic sintered body of $BaTiO_3$ is described in J. B. MacCHESNEY et al., J. Am. Ceram. Soc., 46(1963)197. Specifically, it is reported that while the time until the occurrence of the dielectric breakdown was 2 hours in one to which no $La_2O_3$ has been doped, it increased up to 1000 hours or more in one to which 0.50 mol % of $La_2O_3$ has been doped.

Further, R. Waser et al., J.Am.Ceram.Soc., 73(1990) 1645 describes an experimental case in which the increase of leak current was suppressed, when energized in high temperature, by doping 0.3 mol % of La to a $SrTiO_3$ bulk ceramic sintered body.

Further, Japanese Unexamined Patent Publication JP-A 6-326250 (1994)(TI) describes a case in which $(Ba, Sr)TiO_3$ to which 0.25 mol % or more of La, Er and the like has been doped is used as a high dielectric material.

Although all of the prior art technologies described above use the bulk ceramic sintered body to which La is doped as a dielectric material, it is difficult to contain a desired content of La in the process for forming this film. Further, although Japanese Unexamined Patent Publication JP-A 6-326250 (1994) describes about the use of Er, of which content is set at 0.25 mol % or more, the time until the occurrence of a dielectric breakdown is short when the content is 0.25 mol % or more.

SUMMARY OF THE INVENTION

Hence, it is an object of the present invention to solve the aforementioned problems by providing a dielectric thin film capacitor element, in which leak current can be suppressed from increasing over time while energizing at high temperature and which has excellent insulating quality and reliability, and providing a method of manufacturing the same.

In order to solve the aforementioned problem, the present invention provides a dielectric thin film capacitor element comprising a lower electrode, a dielectric thin film and an upper electrode, the lower electrode, the dielectric thin film and the upper electrode being formed one after another on a substrate, wherein the dielectric thin film is made of an oxide material composed of at least titanium and strontium and contains from 0.01 mol % to 0.2 mol % erbium.

Further, in the invention it is preferable that the dielectric thin film contains from 0.01 mol % to 0.2 mol % erbium.

Further, in the invention it is preferable that the dielectric thin film contains from 0.01 mol % to 0.15 mol % erbium.

Further, the invention provides a dielectric thin film capacitor element comprising a lower electrode, a dielectric thin film and an upper electrode, the lower electrode, the dielectric thin film and the upper electrode being formed one after another on a substrate, wherein the dielectric thin film is made of barium strontium titanate containing from 0.01 mol % to 0.25 mol % erbium.

Further, in the invention it is preferable that the dielectric thin film contains from 0.01 mol % to 0.2 mol % erbium.

Further in the invention it is preferable that the dielectric thin film contains from 0.02 mol % to 0.2 mol % erbium.

Further, the invention provides a method of manufacturing a dielectric thin film capacitor element comprising a lower electrode, a dielectric thin film, and an upper electrode, the lower electrode, the dielectric thin film and the upper electrode being formed one after another on a substrate, the method comprising:

forming the dielectric thin film by a sputtering process using a sputtering target made of an oxide material containing at least titanium, strontium and erbium.

Further, in the invention it is preferable that a strontium titanate thin film containing erbium is formed as the dielectric thin film using as the sputtering target a mixture of strontium titanate powder and erbium oxide powder, and a mixing mole ratio of the erbium oxide is from 0.005% to 0.1%.

Further, in the invention it is preferable that a barium strontium titanate thin film containing erbium is formed as the dielectric thin film using as the sputtering target a mixture of barium strontium titanate powder and erbium oxide powder, and a mixing mole ratio of the erbium oxide is from 0.005% to 0.15%.

The operation of the invention is exerted as follows. When oxygen vacancy exists within the oxide high dielectric thin film such as $SrTiO_3$ and $(Ba, Sr)TiO_3$, electron is introduced as a carrier and the more number of the oxygen vacancies contained in the thin film, the less the specific resistance of the dielectric thin film becomes as described above. The oxygen vacancy tends to occur when oxygen drops out of a lattice position of crystal in the same time with Sr or Ba and is called as a Shottky type defect.

When Er is doped during the growth of the $SrTiO_3$ or $(Ba, Sr)TiO_3$ thin film, Sr is substituted by Er. Because Er is +trivalent at this time, it becomes +monovalent at Sr lattice position and acts as a donor of electron. Accordingly, in the case of the $SrTiO_3$ thin film for example, the following relational equation holds from the law of conservation of mass and the condition of electrical neutrality within the $SrTiO_3$ thin film to which Er has been doped.

$$n+2\ [V_{Sr}]=p+2[V_O]+[M_h]$$

where, n is concentration of electrons, p is concentration of positive holes, $[V_{Sr}]$ is density of lattice defects of Sr (−bivalent), $[V_O]$ is concentration of oxygen vacancies (+bivalent), and $[M_h]$ is concentration of doped Er. From this relational equation, $[V_O]$ may be generated less because $[M_h]$ exists, so that the generation of the oxygen vacancy during the growth of the dielectric thin film caused by the shottky type defect may be suppressed because Er is substituted at the Sr lattice position. However, because the concentration of carriers increases too much and the resistivity decreases in contrary when the concentration of Er is too high, there exists an upper limit of the concentration of Er necessary for suppressing the generation of the oxygen vacancies. Further, because Er assumes +trivalent stably as valence and is readily substituted at Ti site, it acts as a donor within the oxide dielectric thin film such as $SrTiO_3$ and $(Ba, Sr)TiO_3$.

As described above, the inventive dielectric thin film capacitor element and the method for manufacturing the dielectric thin film capacitor element provide the dielectric thin film capacitor element whose insulating quality hardly degrades even when it is operated more than 1000 hours in high temperature while applying DC voltage, so that a thin film capacitor for IC having an excellent reliability may be realized.

Further, because erbium is doped to the dielectric thin film, it may be readily doped at a desired content as compared to doping La and the dielectric thin film capacitor element having uniform characteristics may be realized.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
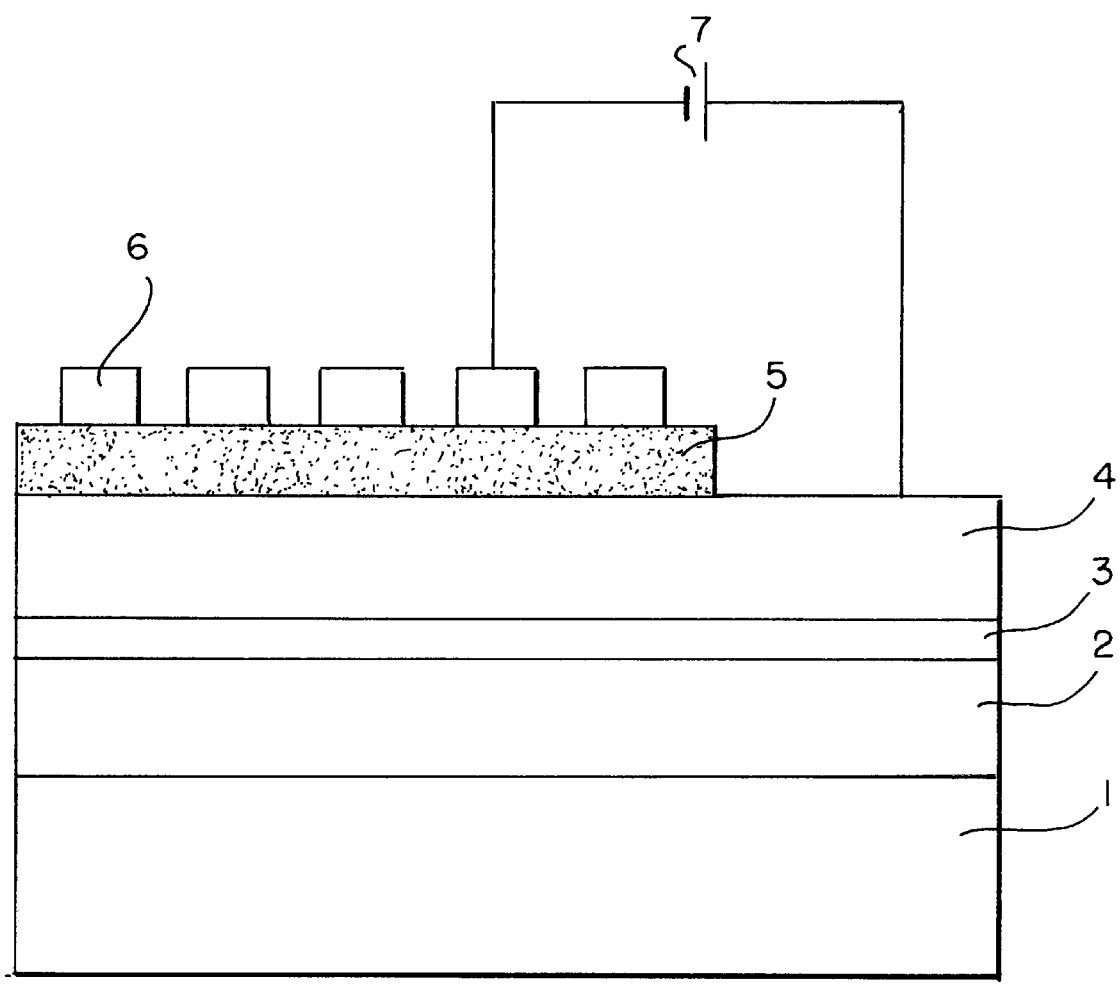
FIG. 1 is a schematic section view showing a structure of a dielectric thin film capacitor element according to the present invention.

Now referring to the drawings, preferred embodiments of the invention are described below.

One embodiment for carrying out the invention will be explained below with reference to the drawings.

FIG. 1 is a schematic drawing showing a sectional structure of a dielectric thin film capacitor element fabricated in accordance with one embodiment for carrying out the invention. As shown in FIG. 1, in this dielectric thin film capacitor element are formed a silicon thermal oxide film 2, a Ti adhesion layer 3, a Pt lower electrode layer 4, a dielectric thin film 5 made of an oxide material composed of titanium and strontium and containing erbium, and a Pt upper electrode layer 6 one after another on an n-type silicon substrate 1.

It is noted that the structure shown in FIG. 1 is given merely for the purpose of evaluating the basic electrical characteristics of the dielectric thin film capacitor element of the present embodiment described later and the structure of the inventive dielectric thin film capacitor element is not limited only to that. It is actually used in free and appropriate design in various devices including memory devices such as a DRAM and a MMIC.

Next, a method for fabricating the dielectric thin film capacitor element of the first embodiment will be explained.

At first, the silicon thermal oxide film 2 having a thickness of 200 nm is formed as an insulating layer on the surface of the n-type silicon substrate 1 by means of thermal oxidation. Then, the Ti adhesion layer 3 having a thickness of 30 nm and the Pt lower electrode layer 4 having a thickness of 200 nm are formed one after another on the silicon thermal oxide film 2 by means of DC sputtering.

Then, the dielectric thin film 5 made of an oxide material composed of titanium and strontium and containing erbium is formed on the Pt lower electrode layer 4 formed as described above by means of RF sputtering (radio-frequency sputtering). In the present embodiment, a plurality of samples have been fabricated as the dielectric thin film 5: ones formed by a strontium titanate ($SrTiO_3$) thin film (hereinafter referred to as a STO thin film) in which content of erbium is changed and the other ones formed by a barium strontium titanate ($(Ba, Sr)TiO_3$) thin film (hereinafter referred to as a BST thin film) in which content of erbium is changed.

A method for forming the dielectric thin film 5 will be explained below.

As a sputtering target, a material obtained by fully mixing erbium oxide ($Er_2O_3$) with $SrTiO_3$ powder or with $SrTiO_3$ powder and $BaTiO_3$ powder so that an erbium (Er) concentration within the STO thin film or the BST thin film turns out to be a desired concentration, and sintering was used. That is, in forming the STO thin film in which the erbium content is x mol %, a material obtained by mixing arbium oxide ($Er_2O_3$) with $SrTiO_3$ powder so that the mole ratio of the $SrTiO_3$ powder to the $Er_2O_3$ powder turns out to be 1:x/200, and sintering was used. Further, in forming the BST thin film in which the erbium content is x mol %, a material obtained by mixing erbium oxide ($Er_2O_3$) with $SrTiO_3$ powder and $BaTiO_3$ powder so that the mole ratio of the $BaTiO_3$ powder and $SrTiO_3$ powder to the $Er_2O_3$ powder turns out to be 0.7:0.3:x/200, and sintering was used.

Then, prior to forming the dielectric thin film 5, the surface of the sputtering target was sputtered preliminarily for 10 minutes under the same condition for forming the thin film (the STO thin film or the BST thin film) to be formed. The conditions of the preliminary sputtering and for forming the STO thin film or the BST thin film were set as follows as shown in Table 1: 4.25 W/cm² of sputtering RF power, 2 Pa of sputtering pressure (pressure of gas within a film forming chamber) and $O_2$ sputtering gas. Under these conditions, the STO thin film or the BST thin film having a thickness of 300 nm was formed. Temperature of the substrate was set at 325° C. in forming the STO thin film and at 350° C. in forming the BST thin film.

It is noted that in the present embodiment, nine kinds of samples of the STO thin film in which the content of Er was changed as 0, 0.01, 0.15, 0.02, 0.05, 0.10, 0.15, 0.2, and 0.3 mol % were fabricated and nine kinds of samples of the BST thin film in which the content of Er was changed as 0, 0.01, 0.015, 0.02, 0.05, 0.10 0.2, 0.3, and 0.5 mol % were fabricated.

TABLE 1

| Film Forming Conditions | |
| --- | --- |
| Sputtering RF Power | 4.25 W/cm² |
| Sputtering Pressure | 2 Pa |
| Sputtering Gas | $O_2$ |

After that, the Pt upper electrode layers 6 having a thickness of 100 nm was formed on the dielectric thin film 5 of each sample by means of electron beam deposition with a circle of 100 μm in diameter in order to evaluate electrical characteristics of the dielectric thin film capacitor elements of the present embodiment. Then, the fabrication of the dielectric thin film capacitor elements having the structure as shown in FIG. 1 was completed.

It is noted that the present invention is not confined only to the present embodiment as for the material, thickness, forming method and the like of the substrate, the insulating layer, the Ti adhesion layer 3 and the electrode layers.

Then, time change of leak current of each sample of 18 kinds of the dielectric thin film capacitor elements in total fabricated as described above was measured while applying DC voltage 7 of 10 V between the Pt upper electrode 6 and the Pt lower electrode 4 and while holding the temperature at 100° C. (high temperature energizing). Tables 2 and 3 show measured results of time (tch) until when the leak current increases by one digit after starting to energize in high temperature, dielectric constant and specific resistance of each sample whose Er content (doped Er amount) is different from each other.

TABLE 2

Characteristics of Er Doped STO Thin Film

| Doped Er Amount (mol %) | tch (hour(s)) | Dielectric Constant | Specific Resistance(Ω cm) |
| --- | --- | --- | --- |
| 0 (non doped) | 5 | 120 | 5.2E + 13 |
| 0.01 | 750 | 120 | 6.3E + 14 |
| 0.015 | >1000 | 120 | 6.8E + 14 |
| 0.02 | >1000 | 121 | 7.0E + 14 |
| 0.05 | >1000 | 122 | 6.7E + 14 |
| 0.10 | >1000 | 120 | 6.0E + 14 |
| 0.15 | 940 | 118 | 5.0E + 14 |
| 0.2 | 440 | 113 | 3.1E + 14 |
| 0.3 | 80 | 90 | 4.3E + 13 |

TABLE 3

Characteristics of Er Doped BST Thin Film

| Doped Er Amount (mol %) | tch (hour(s)) | Dielectric Constant | Specific Resistance(Ω cm) |
| --- | --- | --- | --- |
| 0 (non doped) | 6 | 130 | 4.1E + 13 |
| 0.01 | 680 | 132 | 5.6E + 14 |
| 0.015 | 980 | 133 | 7.2E + 14 |
| 0.02 | >1000 | 132 | 7.8E + 14 |
| 0.05 | >1000 | 131 | 8.0E + 14 |
| 0.10 | >1000 | 130 | 7.1E + 14 |
| 0.2 | >1000 | 128 | 6.0E + 14 |
| 0.3 | 670 | 112 | 3.0E + 14 |
| 0.4 | 210 | 96 | 3.2E + 13 |

Figure 2:
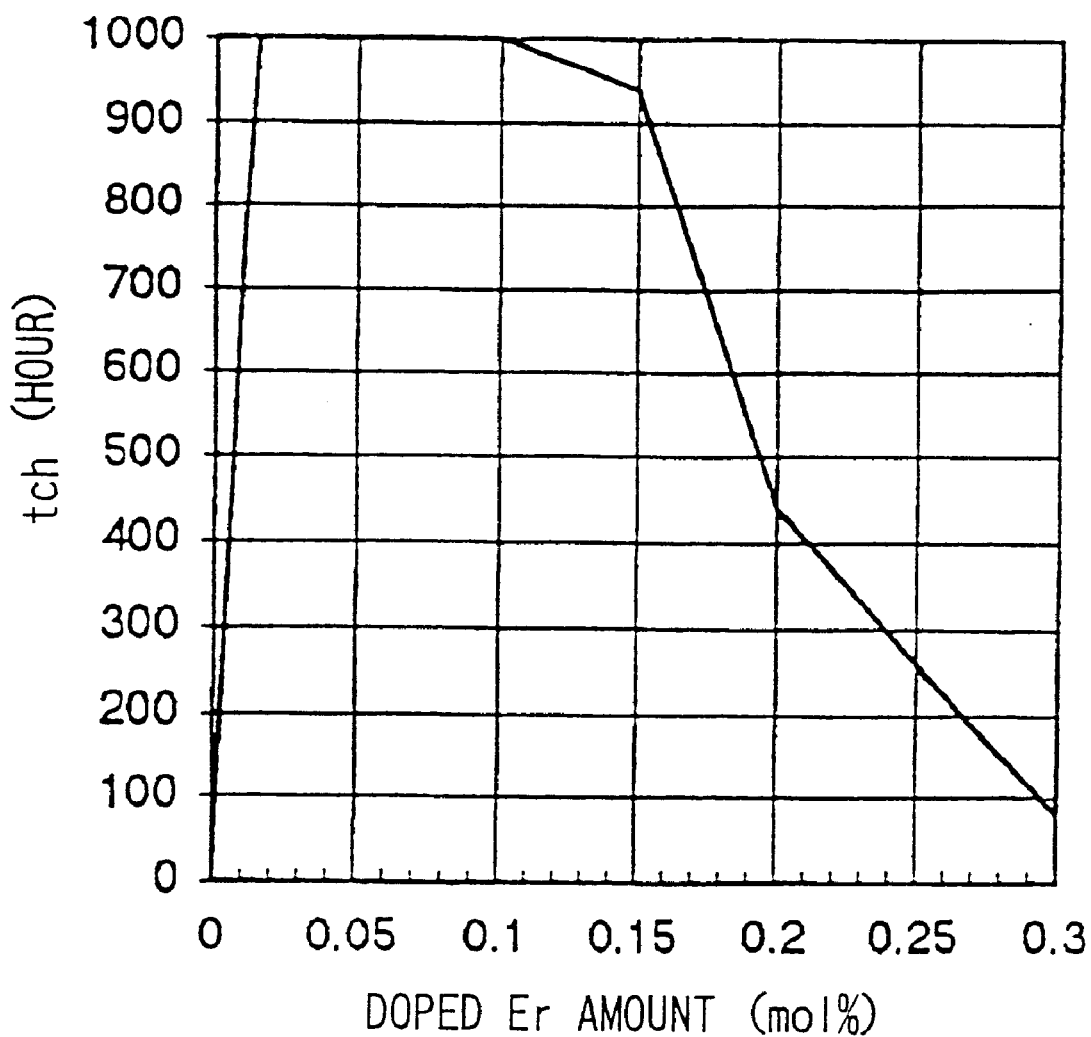
FIG. 2 is a graph showing a dependency of tch on a doped Er amount in an Er doped STO thin film.
Figure 3:
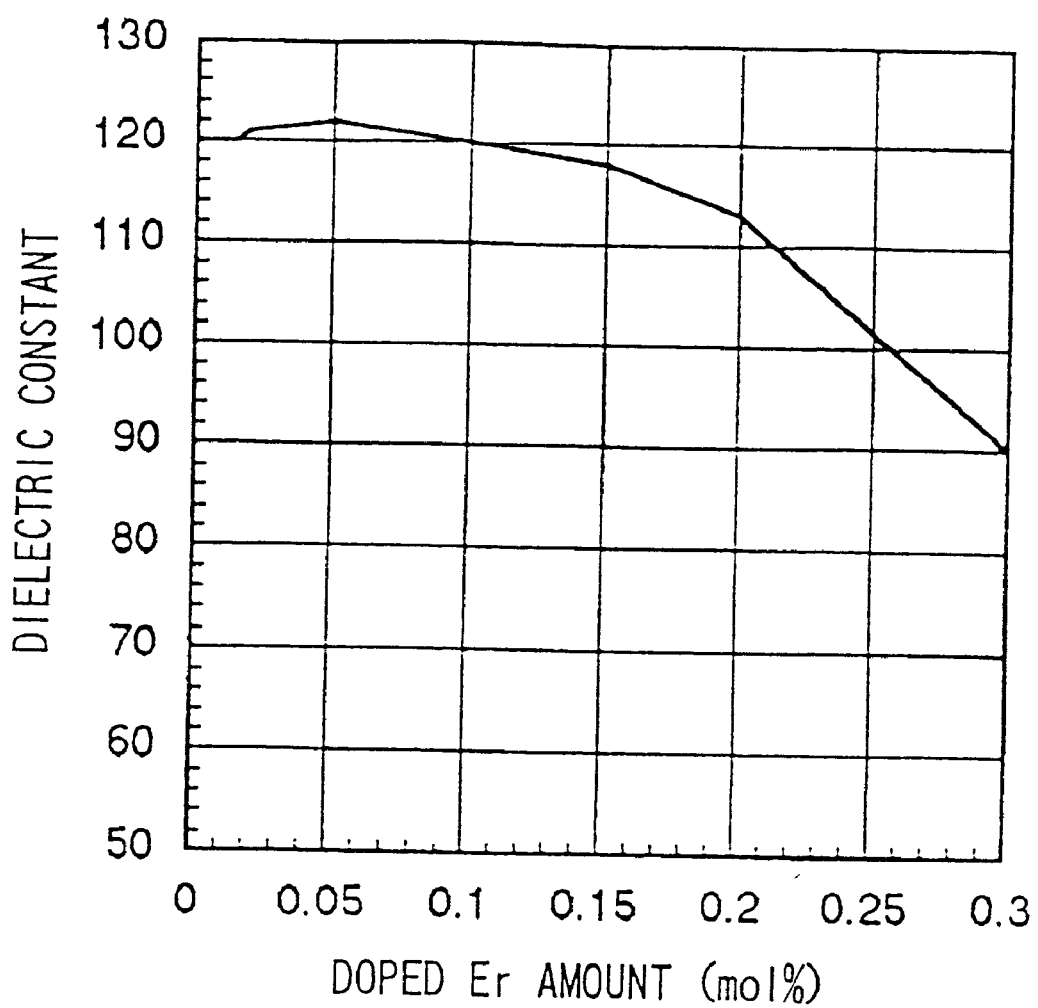
FIG. 3 is a graph showing a dependency of dielectric constant on the doped Er amount in the Er doped STO thin film.
Figure 4:
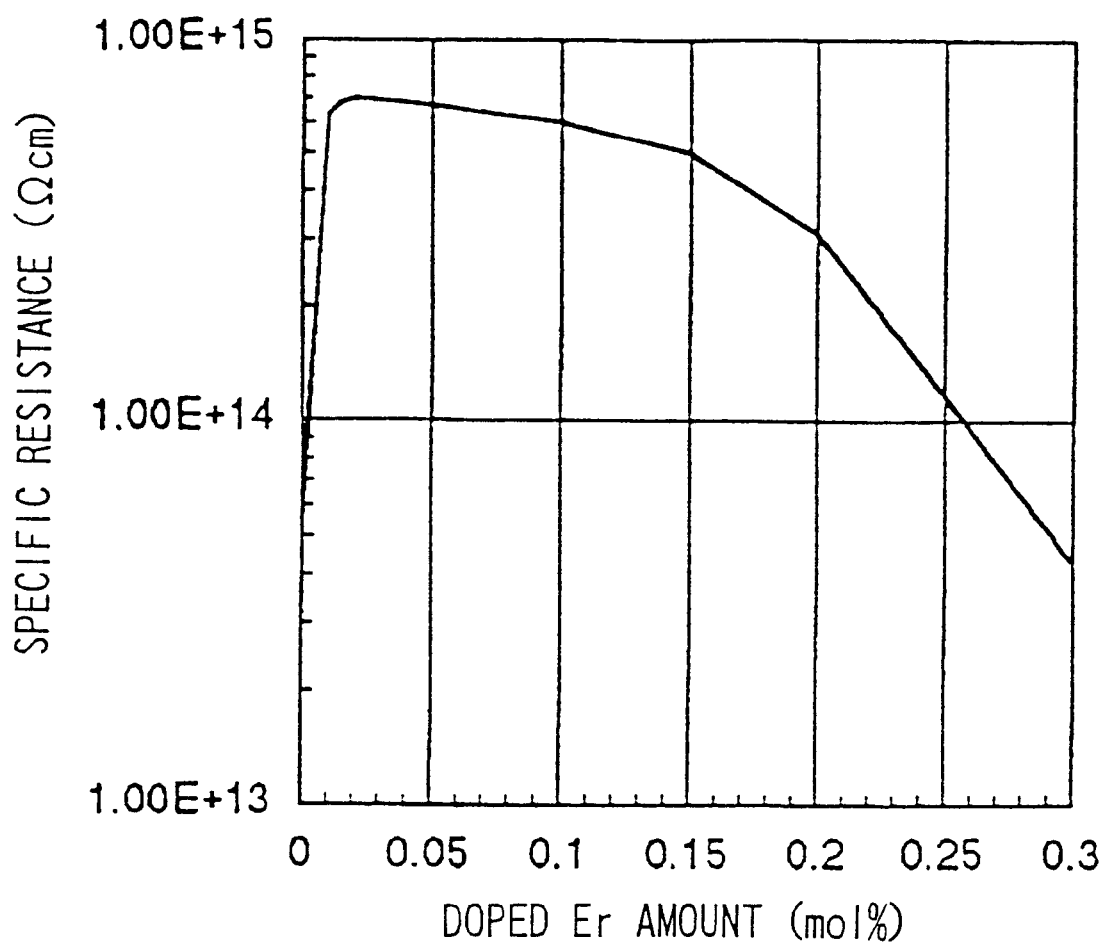
FIG. 4 is a graph showing a dependency of specific resistance on the doped Er amount in the Er doped STO thin film.

FIG. 2 is a graph of a dependency on the doped Er amount of tch in the Er doped STO thin film, FIG. 3 is a graph of a dependency on the doped Er amount of dielectric constant in the Er doped STO thin film, and FIG. 4 is a graph of a dependency on the doped Er amount of specific resistance in the Er doped STO thin film, respectively, which are graphed based on the measured results in Table 2. It can be seen from Table 2 and FIG. 2 that as compared to that tch of one whose doped Er amount (content) is zero, i.e. containing no Er, is five hours, those whose doped Er amount (content) is from 0.01 mol % to 0.2 mol % have an excellent characteristic that tch is 400 hours or more and, specifically, those whose doped Er amount (content) is from 0.015 mol % to 0.10 mol % have a very excellent characteristic that tch is 1000 hours or more.

It can be seen from Table 2 and FIG. 3 that as compared to that dielectric constant of one whose doped Er amount (content) is zero, i.e. containing no Er, is 120, those whose doped Er amount (content) is from 0.01 mol % to 0.2 mol % have a favorable characteristic, having a fully high dielectric constant that their dielectric constant is 110 or more. It can be seen from Table 2 and FIG. 4 that as compared to that specific resistance of one whose doped Er amount (content) is zero, i.e. containing no Er, is $5.2 \times 10^{13}$ Ωcm, those whose doped Er amount (content) is from 0.01 mol % to 0.2 mol % have an excellent characteristic that their specific resistance is $3.0 \times 10^{14}$ Ωcm or more and, specifically, those whose doped Er amount (content) is from 0.01 mol % to 0.15 mol % have a very excellent characteristic that their specific resistance is $5.0 \times 10^{14}$ Ωcm or more.

Figure 5:
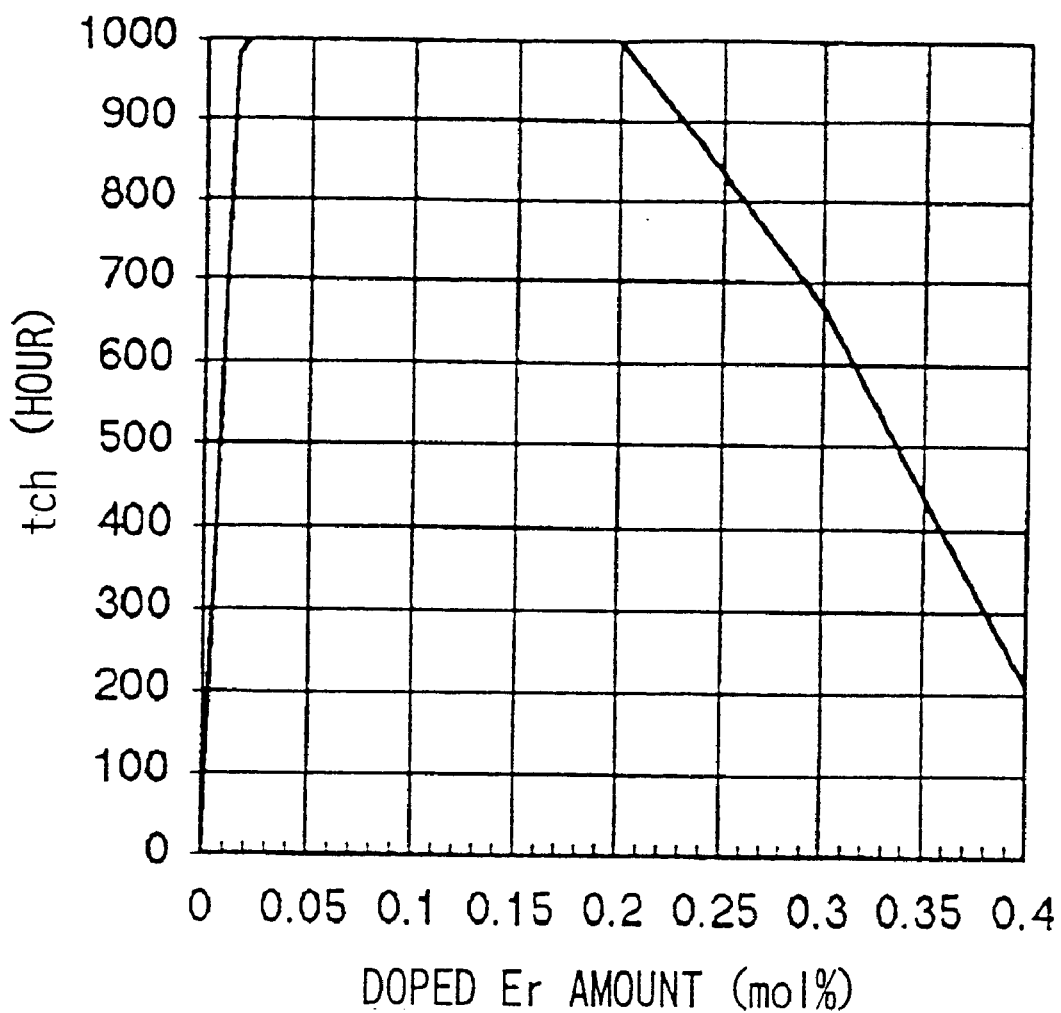
FIG. 5 is a graph showing a dependency of tch on the doped Er amount in an Er doped BST thin film.
Figure 6:
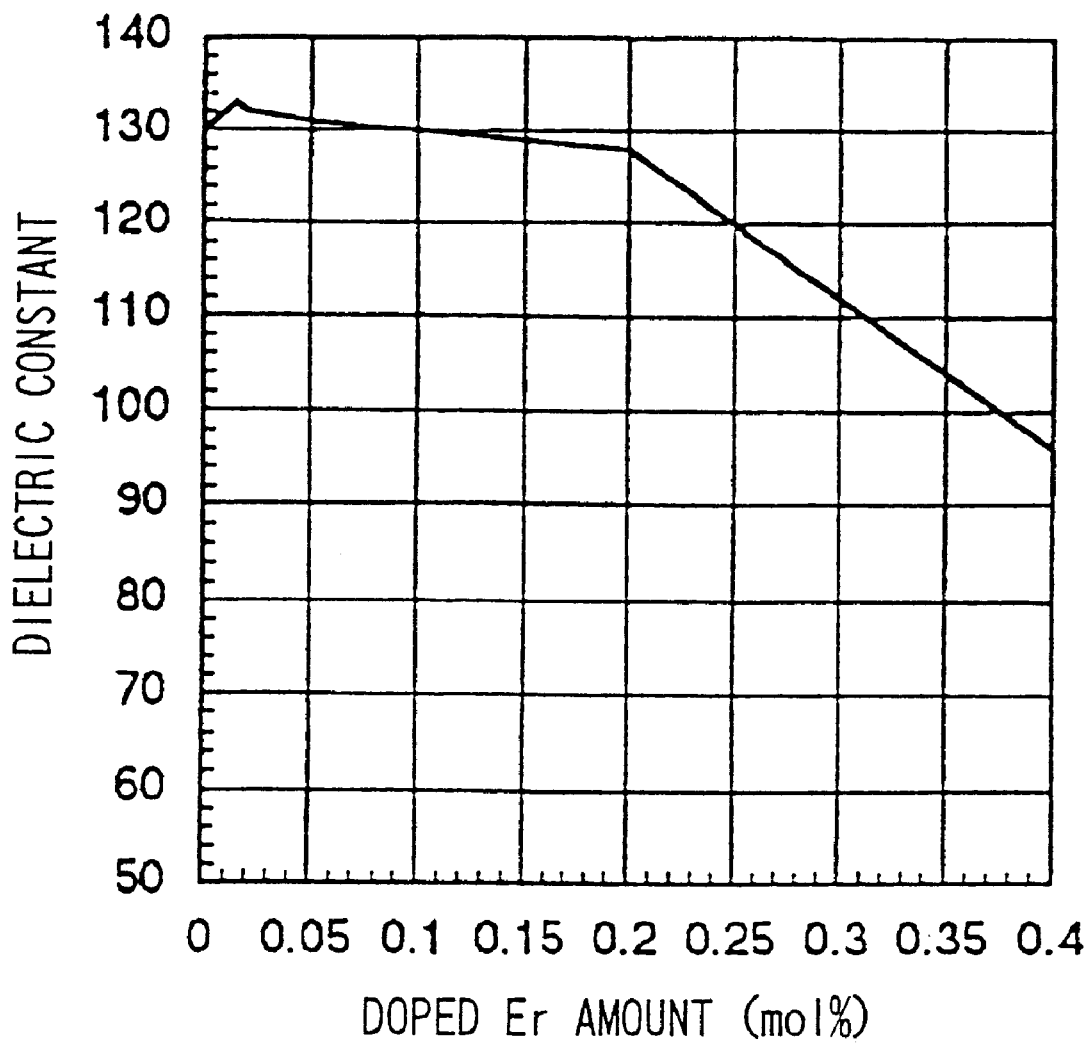
FIG. 6 is a graph showing a dependency of dielectric constant on the doped Er amount in the Er doped BST thin film.
Figure 7:
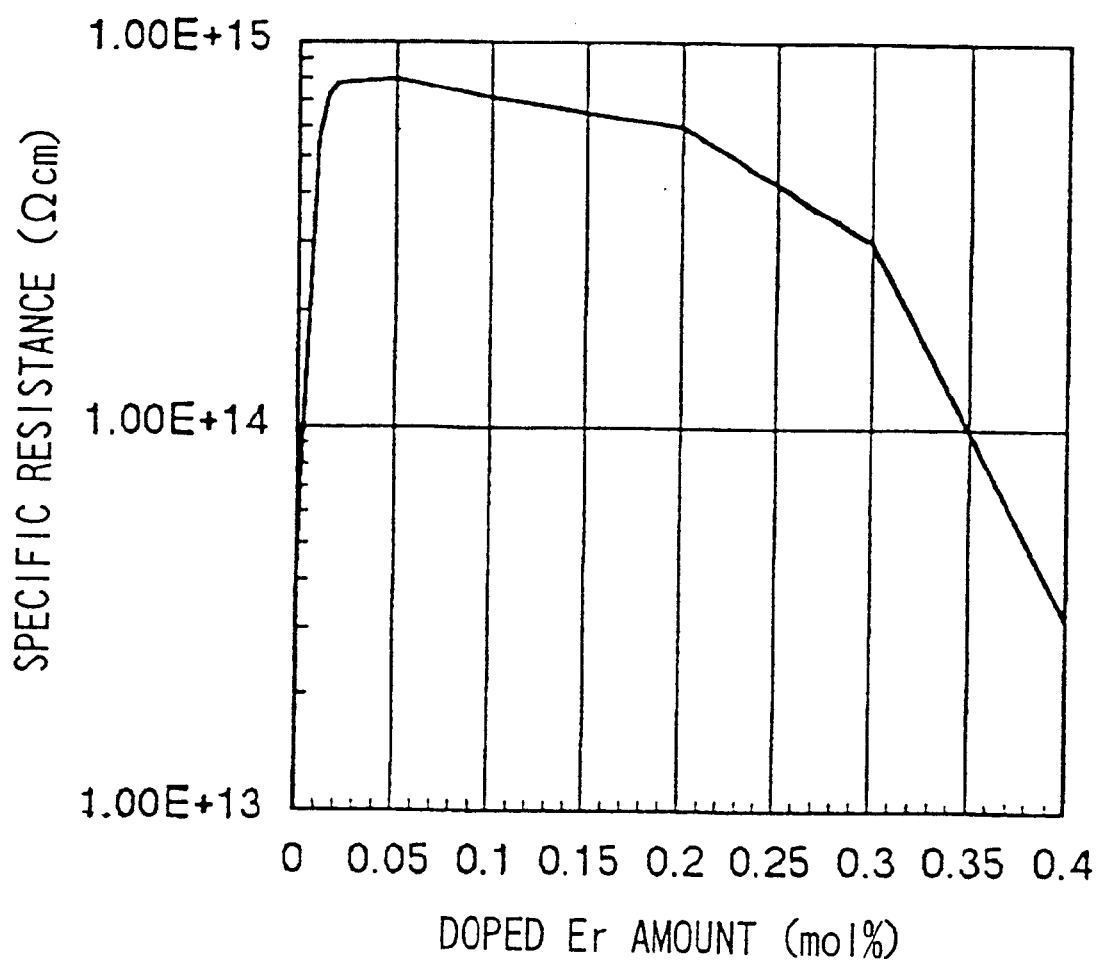
FIG. 7 is a graph showing a dependency of specific resistance on the doped Er amount in the Er doped BST thin film.

FIG. 5 is a graph of a dependency on the doped Er amount of tch in the Er doped BST thin film, FIG. 6 is a graph of a dependency on the doped Er amount of dielectric constant in the Er doped BST thin film, and FIG. 7 is a graph of a dependency on the doped Er amount of specific resistance in the Er doped BST thin film, respectively, which are graphed based on the measured results in Table 3. It can be seen from Table 3 and FIG. 5 that as compared to that tch of one whose doped Er amount (content) is zero, i.e. containing no Er, is six hours, those whose doped Er amount (content) is from 0.01 mol % to 0.25 mol % have an excellent characteristic that tch is 500 hours or more and, specifically, those whose doped Er amount (content) is from 0.02 mol % to 0.2 mol % have a very excellent characteristic that tch is 1000 hours or more.

It can be seen from Table 3 and FIG. 6 that as compared to that dielectric constant of one whose doped Er amount (content) is zero, i.e. containing no Er, is 130, those whose doped Er amount (content) is from 0.01 mol % to 0.25 mol % have a favorable characteristic, having a fully high dielectric constant that their dielectric constant is 110 or more. It can be seen from Table 3 and FIG. 7 that as compared to that specific resistance of one whose doped Er amount (content) is zero, i.e. containing no Er, is $4.1 \times 10^{13}$ Ωcm, those whose doped Er amount (content) is from 0.01 mol % to 0.25 mol % have an excellent characteristic that their specific resistance is $3.0 \times 10^{14}$ Ωcm or more and, specifically, those whose doped Er amount (content) is from 0.01 mol % to 0.2 mol % have a very excellent characteristic that their specific resistance is $5.0 \times 10^{14}$ Ωcm or more.

From above, characteristic time tch was prolonged in those STO thin films whose Er content is from 0.01 mol % to 0.2 mol % and a remarkable effect could be seen as against the degradation of the capacitor. The characteristic time tch was also prolonged in those BST thin films whose Er content is from 0.01 mol % to 0.25 mol % and a remarkable effect could be seen as against the degradation of the capacitor. It is also considered that according to the invention, the oxygen vacancies within the thin film may be reduced without degrading the dielectric constant and specific resistance by containing Er to the dielectric thin film having the oxygen vacancies and composed of at least titanium and strontium, allowing to obtain the dielectric thin film capacitor element having an excellent reliability.

While the STO thin film and the BST thin film containing Er have been explained in the embodiment described above, a result obtained by fabricating a STO thin film containing lanthanum (La) having +trivalent which is the same with Er in the same manner with the STO thin film containing Er in the above-mentioned embodiment to study Er content or La content within the STO thin film with respect to a number of times of formation thereof will be explained as a comparative example. It is noted that the fabrication of the comparative example is different from that of the above-mentioned embodiment only in that a material obtained by fully mixing lanthanum oxide ($La_2O_3$) with the $SrTiO_3$ powder so that lanthanum (La) concentration within the STO thin film turns out to be a desirable concentration, and sintering was used. That is, a material obtained by mixing the $SrTiO_3$ powder and the $La_2O_3$ powder so that mole ratio thereof is 1:x/200 in forming the STO thin film containing x mol % of La content, and sintering was used.

Figure 8:
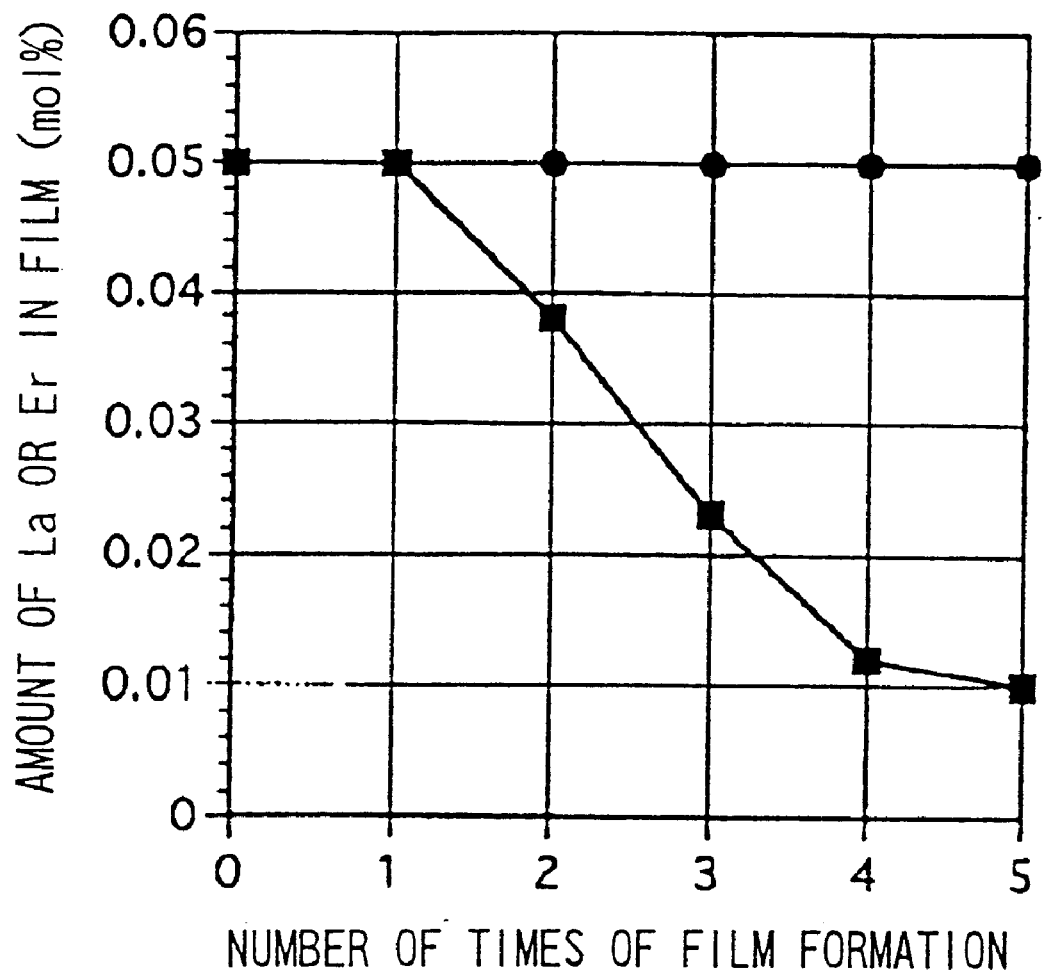
FIG. 8 is a graph showing a dependency of an amount of La or Er on a number of times of formation within the STO thin film.

FIG. 8 shows the results obtained by studying the Er content within the STO thin film formed by implementing a plurality of times of formation by means of sputtering by using the same sputtering target so that the Er content within the STO thin film of the present embodiment turns out to be 0.05 mol % and the La content within the STO thin film formed by implementing a plurality of times of formation by means of sputtering by using the same sputtering target so that the La content within the STO thin film of the comparative example turns out to be 0.05 mol %. It can be seen from FIG. 8 that while the Er content is constant at 0.05 mol % in any of the five times of formation in the STO thin film containing Er, the La content drops as the number of times of formation increases and the La content is 0.01 mol % in the fifth time of formation in the STO thin film containing La. It can be understood from this fact that the dielectric thin film containing Er may be formed with a good reproducibility by using the sputtering which is excellent in productivity and the dielectric thin film capacitor element having a homogeneous characteristic may be manufactured with a high productivity.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A dielectric thin film capacitor element comprising:

a lower electrode;

a dielectric thin film; and an upper electrode, the lower electrode, the dielectric thin film and the upper electrode being formed one after another on a substrate, wherein the dielectric thin film is made of an oxide material composed of at least titanium and strontium and contains from 0.01 mol % to 0.2 mol % erbium.

2. The dielectric thin film capacitor element of claim 1, wherein the dielectric thin film is made of strontium titanate containing from 0.01 mol % to 0.2 mol % erbium.

3. The dielectric thin film capacitor element of claim 2, wherein the dielectric thin film is made of strontium titanate containing from 0.01 mol % to 0.15 mol % erbium.

4. A dielectric thin film capacitor element comprising:

a lower electrode;

a dielectric thin film; and an upper electrode, the lower electrode, the dielectric thin film and the upper electrode being formed one after another on a substrate, wherein the dielectric thin film is made of barium strontium titanate containing from 0.01 mol % to 0.25 mol % erbium.

5. The dielectric thin film capacitor element of claim 4, wherein the dielectric thin film is made of barium strontium titanate containing from 0.01 mol % to 0.2 mol % erbium.

6. The dielectric thin film capacitor element of claim 5, wherein the dielectric thin film is made of barium strontium titanate containing from 0.02 mol % to 0.2 mol % erbium.

* * * * *